United States Patent [19]

Strakovsky

[11] Patent Number: 5,678,209
[45] Date of Patent: Oct. 14, 1997

[54] TRANSMIT POWER LEVEL DETECTION CIRCUIT WITH ENHANCED GAIN CHARACTERISTICS

[75] Inventor: Leonid Strakovsky, Rumson, N.J.

[73] Assignee: Lucent Technologies Inc., Murray Hill, N.J.

[21] Appl. No.: 414,668

[22] Filed: Mar. 31, 1995

[51] Int. Cl.$^6$ .................................. H01Q 11/12; H04B 1/04
[52] U.S. Cl. .................................. 455/126; 455/115
[58] Field of Search .................................. 455/82, 83, 126, 455/115; 333/17.1, 109; 330/278, 279

[56] References Cited

U.S. PATENT DOCUMENTS

| | | | |
|---|---|---|---|
| 4,009,446 | 2/1977 | De Koning et al. | 330/53 |
| 4,127,831 | 11/1978 | Riblet . | |
| 4,523,155 | 6/1985 | Walczak et al. | 330/279 |
| 4,823,098 | 4/1989 | Demuro et al. | 455/78 |
| 4,963,945 | 10/1990 | Cooper et al. | 455/307 |
| 5,032,802 | 7/1991 | Fry | 333/109 |
| 5,038,112 | 8/1991 | O'Neill | 330/207 |
| 5,196,806 | 3/1993 | Ichihara | 330/137 |
| 5,337,006 | 8/1994 | Miyazaki | 455/126 |
| 5,337,020 | 8/1994 | Daughtry et al. | 330/279 |
| 5,339,462 | 8/1994 | Staudinger et al. | 455/330 |
| 5,361,403 | 11/1994 | Dent | 455/126 |
| 5,363,071 | 11/1994 | Schwent et al. | 333/111 |
| 5,367,268 | 11/1994 | Baba | 330/129 |
| 5,481,231 | 1/1996 | Dydyk et al. . | |

*Primary Examiner*—Chi H. Pham
*Assistant Examiner*—Gertrude Arthur
*Attorney, Agent, or Firm*—Steven R. Bartholomew; Brian K. Dinicola

[57] ABSTRACT

A circuit for maintaining the magnitude of a radio frequency (RF) signal at least one predetermined level employs a detection circuit coupled to an RF signal generator by a four port coupling device. In one embodiment of the present invention, an impedance inverter in series with a diode is connected between the load termination of the coupling device and ground. The series combination of the impedance inverter and diode approximates a short circuit as the output signal power approaches a predetermined low amplitude threshold and approximates an open circuit as the output signal power approaches a predetermined upper amplitude threshold so that gain is provided to signals received by the detection circuit below a first amplitude level and attenuation is provided to signals received by the detection circuit above a second amplitude level. The transmit level detection circuit of the present invention requires substantially less power than conventional circuits, so that only 1%–2% or less of the output of the amplifier need be diverted for reliable operation, even for RF output power levels on the order of a fraction of a milliwatt.

11 Claims, 2 Drawing Sheets

4
TRANSMIT POWER LEVEL DETECTION CIRCUIT WITH ENHANCED GAIN CHARACTERISTICS

BACKGROUND OF THE INVENTION

1. Field of the Invention

The present invention relates generally to control circuits for RF signal power amplifiers and, more particularly, to an improved transmit power level detector for use in such control circuits.

2. Description of the Prior Art

The basic operation and structure of wireless communication systems, such as cellular radio telephone systems and land mobile communication systems, are well known in the art. Subscriber accommodation capacity is typically maximized by maintaining the RF transmission signal output power at a sufficiently low level, within each zone, to permit simultaneous usage of the same radio frequencies in nearby zones. The transmitting power of the radio communication system is generally maintained at one of a plurality of prescribed levels by a transmission signal output control system. Essentially, the transmission signal output control system includes a detection circuit for detecting the power level of the transmission signal output by an RF power amplifier and a circuit responsive to the output of the detection circuit for controlling the gain of the RF power amplifier.

Generally, radiotelephones employ a feedback circuit to control the output of the power amplifier. A portion of the RF output energy is applied to the detection circuit, which circuit provides a power level signal corresponding to the output power level. The power level signal is compared to a reference signal in order to generate a control signal that is used to vary the amplifier's output power and cause the difference between the reference signal and the power signal level signal to be minimized.

Most prior art transmitters that incorporate RF power control employ some form of diode detector to convert the RF carrier to a corresponding DC level. One such transmission signal output control system is depicted in FIG. 1. An RF transmission signal is amplified in an RF amplifier circuit 10 in the final stage and is then supplied through the input and output ports of a four-terminal, transmission line coupler 12 to an antenna output circuit 14. The amplified RF transmission signal output by amplifier circuit 10 is supplied not only to the antenna circuit 14, but also to detector circuit 16 for detection in a conventional manner.

Typically, the coupler 12 is configured to divert approximately 3–5% of the power output by amplifier circuit 10 to detector circuit 16. The detector diode D1 of detector circuit 16 is connected to the couple terminal "C" of coupler 12 and thus, to the output side of the RF amplifier circuit 10. The voltage at the anode of diode D1 is marginally forward biased by means of a biasing circuit 24 that includes a resistor R2, a diode D2, and a resistor R3. A resistor R1 is coupled to the load terminal "L" of coupler 12. The value of resistor R1 is generally selected to match the characteristic impedance of the circuit and may be, for example, on the order of 50 ohms. Due to the match termination, the load termination behaves as if it is of infinite length (no reflection) so that all power supplied to resistor R1 is absorbed and converted to heat.

The half-wave rectified detection signal is supplied to an output level control circuit 18 via a buffer amplifying circuit 20. The output level control circuit 18 compares the output of the buffer amplifier circuit 20 with a variable level reference signal supplied from a reference level generation circuit 22, and controls the amplification of the RF amplifier circuit 10 so that antenna circuit 14 is supplied with an RF signal of the desired output level.

One disadvantage of conventional arrangements such as the one depicted in FIG. 1 is the relatively limited dynamic range of the detector circuit. As will be readily appreciated by those skilled in the art, the dynamic range of the detector circuit is the range of coupled transmitted RF signal power levels at the power detector's input for which the power detector's output signal is usable. The dynamic range of the power detector circuit is related to the power level of the coupled transmitted RF signal. Since the coupler has a fixed coupling coefficient, the fraction of the transmitted output RF signal supplied to the couple terminal of RF coupler 12 remains essentially constant regardless of amplitude. At high transmitter power levels, RF couplers couple a large amount of signal power for detection by the power detector, and a significant portion of the coupled transmitted RF signal is lost. To compensate, the current drain of the transmitter is increased to overcome the loss of power at high power levels, thereby reducing the transmitter's efficiency. At low transmitter power levels, RF couplers provide a low amount of signal power level for detection by the detector circuit. A substantial amount of the diverted signal power is dissipated by the resistor R1. As such, there may not be enough signal power available at the power detector circuit's input to generate a usable output signal. In fact, the circuit of FIG. 1 is unable to detect transmission signals that are below a certain amplitude threshold, which threshold may typically be on the order of 2 to 3 mW or even larger.

SUMMARY OF THE INVENTION

As disclosed herein, a radio frequency (RF) circuit includes an RF signal generating device for generating an RF output signal. The first port of a four-port RF signal coupling device is coupled to the RF signal generating device, which device may be configured, for example, as an RF amplifier. A detection circuit is coupled to the third port for obtaining a measurement of the amplitude of the RF output signal and an impedance termination having an impedance value different from the characteristic impedance is coupled to fourth port so that the third port receives a portion of signal energy delivered by said RF signal generating device and a portion of signal energy reflected from said fourth port In accordance with an illustrative embodiment of the present invention, the impedance termination has a non-linear impedance value which varies with the amplitude of the output power signal. By way of specific example, this is achieved by an impedance inverter in series with a diode. As the transmitted signal approaches a lower amplitude threshold, the diode itself approximates an open circuit. The combination of the diode and impedance inverter thus behaves as a short circuit so that the signal reflected by the diode back to the detector circuit is in phase with the incident signal. With the precise number of reflections being governed by the loss characteristics of the circuit, i.e. the Q-factor, the signal incident on the diode may be reflected and added many times. A substantial increase in gain is thus achieved precisely when it is needed, so that the amplitude threshold for detection is substantially reduced in comparison to conventional power level detection schemes. The transmit level detection circuit of the present invention thus requires substantially less power than conventional circuits, so that only 1%–2% or less of the output of the amplifier need be diverted for reliable operation.

Of course, as the amplitude from the aforementioned increases beyond the low amplitude threshold, the non-linear behavior of the diode initially causes slight clipping of the signal. Such clipping does not materially affect the level of signal power available at the power detector circuit's input until much higher signal levels are achieved. The combination of the diode and impedance inverter is at the same time configured to approach an open circuit condition as the signal incident on the diode approaches a given upper amplitude threshold. As the amplitude of the transmitted RF signal approaches the upper threshold, clipping of the signal by the diode increases, causing the impedance of the diode to decrease. By selecting a diode having the appropriate operating curve, it is thus possible to provide controlled attenuation of higher amplitude signals.

A transmit power level detection circuit constructed in accordance with the present invention has a substantially enhanced dynamic range and thus avoids the deficiencies associated with conventional detection circuits. The present invention provides gain at lower transmit power levels and, optionally, attenuation at higher transmit power levels. Specifically, the present invention allows substantially weaker signals, on the order of 0.5 mW or less in amplitude, to be detected, so that a significantly smaller portion of the RF power amplifier output may be diverted to the detector circuit. When implemented in a telecommunications device such as a radio telephone unit, the detector circuit of the present invention can substantially lengthen the operating cycle time or allow a smaller battery to be used to obtain the same operating cycle time.

In a simplified embodiment of the present invention especially useful for relatively low amplitude signals, illustratively on the order of a fraction of a milliwatt, the impedance termination is configured as a short circuit or shunt path to ground so that the gain is always at a maximum, regardless of the amplitude of the transmitted RF signal.

The aforementioned features and advantages of the present invention will be better understood from the following detailed description taken in conjunction with the accompanying drawings.

BRIEF DESCRIPTION OF THE DRAWINGS

In the drawings, wherein like reference characters denote similar elements throughout the several views.

DETAILED DESCRIPTION OF THE INVENTION

While the invention will be described in connection with a preferred embodiment, there is no intent to limit it to that embodiment. On the contrary, the intent is to cover all alternatives, modifications and equivalents included within the spirit and scope of the invention as defined by the appended claims.

Figure 2:
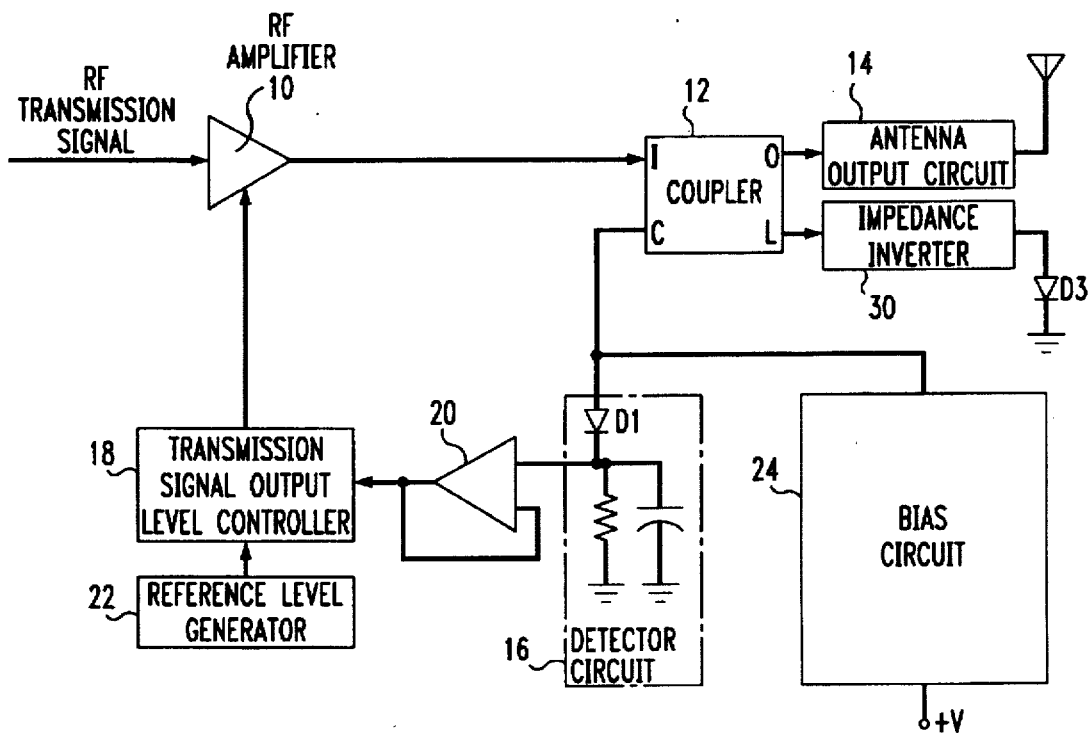
FIG. 2 is a circuit diagram depicting an embodiment of the transmission signal output control circuit according to an illustrative embodiment of the present invention.

Referring now in detail to the drawings, in which like numerals refer to like parts throughout the several views, FIG. 2 shows a block diagram of a communication unit embodying the present invention. Communications units are generally well known in the art and a detailed description of the same is not believed necessary for an understanding of the present invention. It suffices to say that RF signals generated in a conventional manner are supplied to a radio frequency (RF) power amplifier 10, where they are amplified to a desired RF power level, which level may be one of a plurality of predetermined power levels.

The output of power amplifier 10 is coupled to the input terminal I of a conventional four-port, RF coupler 12 and thereafter to antenna output circuit 14 via output terminal O. As will be readily ascertained by those skilled in the art, an RF coupler as coupler 12 generally comprises a primary transmission element (not shown) which interconnects the input and output terminals I and O, and a secondary coupling element (not shown) which interconnects the couple and load terminals C and L. The primary transmission element thus receives at its input terminal an RF input and delivers an RF output at its output terminal. The secondary coupling element couples a portion of the RF signal to produce a coupled RF output signal. The physical dimensions of the primary transmission element and the secondary coupling element and the distance therebetween determine the amount of the RF signal coupled.

The coupled RF signal is output at terminal C of coupler 12 to power detector circuit 16, and is a reduced power level version of the input signal supplied to input terminal. The relationship between the power levels of the signals output at terminals O and C is the coupling factor of RF coupler 12. In accordance with the present invention, the coupling factor is selected large enough to provide enough coupled RF signal for proper operation of the detector circuit 16 at the lowest of the plurality of power levels at which the transmission unit operates. As will soon be described in detail, however, the amount of gain provided by the present invention at the lowest RF power levels ensures that it is not necessary to select a coupling factor which impacts the efficiency of the transmission unit at higher power levels. That is, the selected coupling factor is low enough to avoid coupling off large amounts of power from the primary transmission element when the transmission unit is operating at the higher of the plurality of power levels.

The primary transmission element and first coupling element of RF coupler 12 can be formed from transmission lines in close proximity such as stripline or microstrip, or from any other transmission means allowing directive coupling, for example, aperture coupled waveguides. The coupling constant is selected as desired by changing the physical construction of the primary and coupling elements. For the case of stripline or microstrip couplers, varying the distance between transmission lines, the length over which the lines are in close proximity, or the dielectric constant of the substrate will produce the selected coupling constant.

Figure 1:
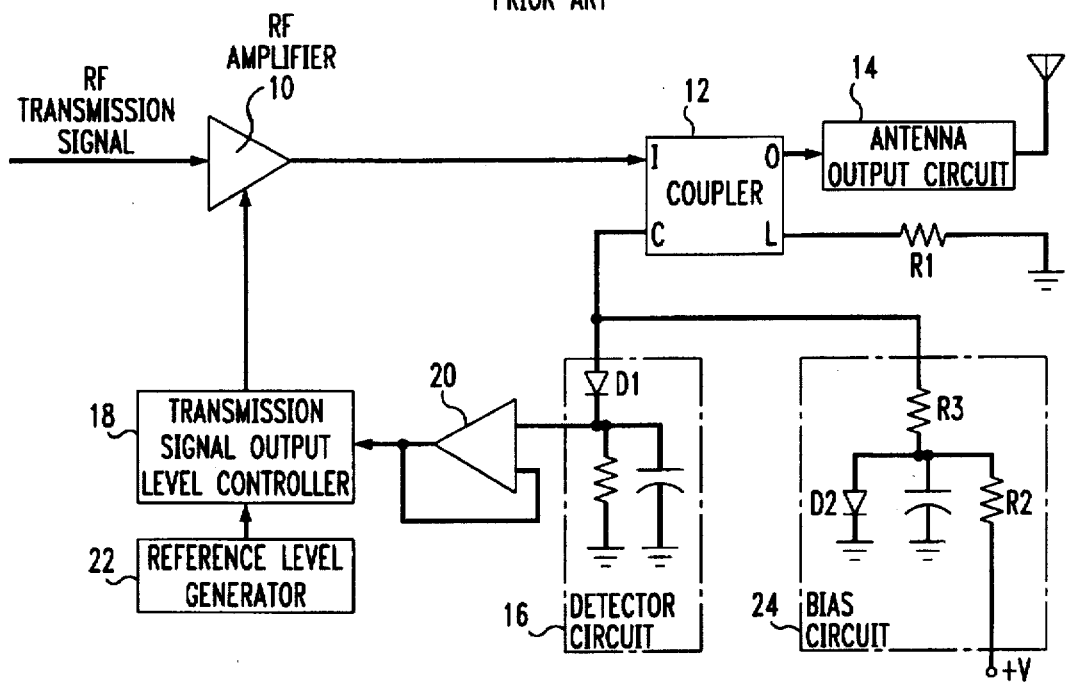
FIG. 1 is a circuit diagram showing a conventional transmission signal output control circuit.

With continued reference to FIG. 2, it will be observed that the load resistor R1 of FIG. 1 has been replaced by an impedance inverter 30 in series with a diode D3. The diode D3 is, for example, a Shottky barrier type diode, while the impedance inverter may be configured as a one-quarter wavelength transmission line or resonator. An impedance inverting transmission line as such, has first and second ends. The value of an impedance at the first end, appears at the second end, to be substantially equal to the mathematical inverse of the value at the first end, and vice versa. If the two conductors of an impedance inverting transmission line are shorted together at the first end, the first end impedance is considered to be zero ohms. The second end impedance will therefore be very high, or near infinity, appearing to be an open circuit. Conversely, if the first end impedance is infinity, as when the two conductors are each not connected to anything, the second end impedance will be near zero and may be considered to define a short circuit condition.

Diode D3 acts as a controlled resistance. As the transmitted signal approaches a lower amplitude threshold, say on the order of one-hundredth of a milliwatt, the diode D3 itself approximates an open circuit. The combination of diode D3 and impedance inverter 30 therefore behaves as a short circuit so that the signal reflected by diode D3 back to the detector circuit 16 is in phase with the incident signal. With the precise number of reflections being governed by the loss characteristics of the circuit, i.e. the Q-factor, the signal incident on diode D3 may be reflected and added many times at the couple port C of the RF coupler 12. Each time the incident signal is reflected, the gain increases correspondingly such that a maximum gain on the order of 50 or more may be easily achieved. A substantial increase in gain is thus achieved precisely when it is needed, so that the amplitude threshold for detection is substantially reduced in comparison to conventional power level detection schemes. Of course, as the amplitude of the RF signal increases beyond the low amplitude threshold, the nonlinear behavior of diode D3 initially causes slight clipping of the signal. Such clipping does not materially affect the level of signal power available at the power detector circuit's input until much higher signal levels are achieved, as will now be explained.

The combination of diode D3 and impedance inverter 30 is at the same time configured to approach an open circuit condition as the signal incident on the diode approaches a given upper amplitude threshold. As the amplitude of the transmitted RF signal approaches the upper threshold, diode D3 increasingly clips the signal. By selecting a diode having the appropriate operating curve, it is thus possible to provide controlled attenuation of higher amplitude signals.

In the conventional arrangement of FIG. 1, the magnitude of the signal received by the detection circuit has a linear correspondence to the transmitted RF signal. As a result of the non-linearity introduced by diode D3, it is necessary to consider the effects of gain and attenuation on the detection signal prior when setting the reference voltage level(s) to be provided by reference level generator 22. This is believed to be within the level of skill of the ordinary artisan and a detailed description of the level setting process has therefore been omitted.

Figure 3:
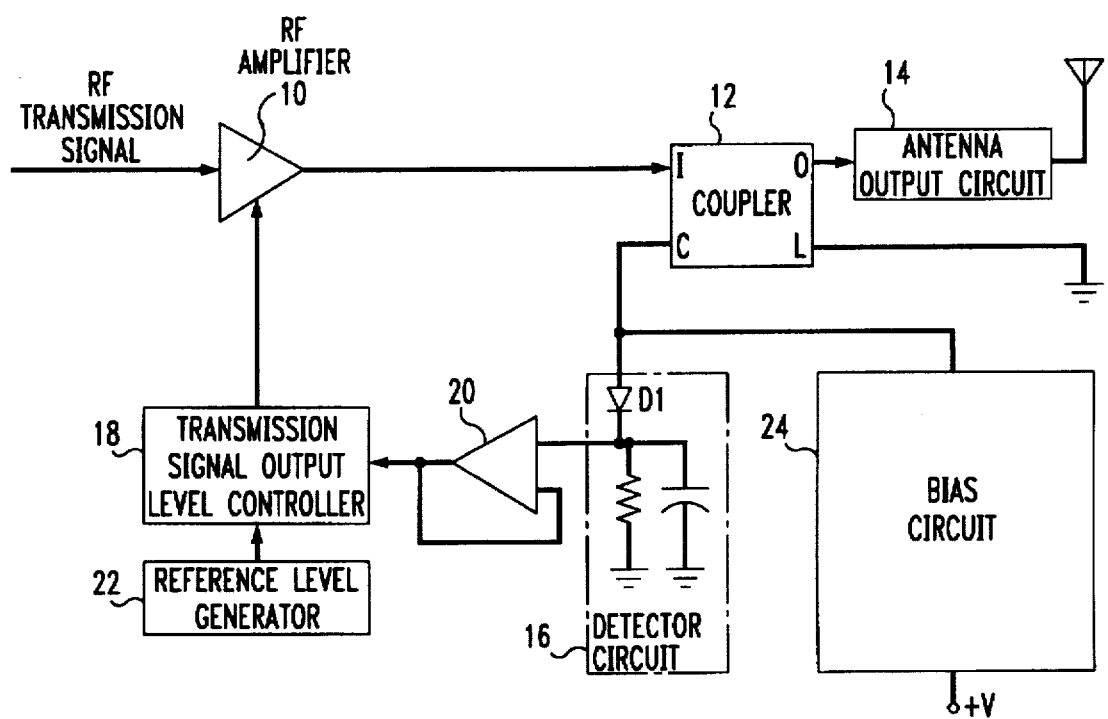
FIG. 3 is a circuit diagram depicting a modified embodiment of the transmission signal output control circuit according to the present invention.

A modified embodiment, which is especially suited for situations in which only relatively low transmit power levels will be encountered, is presented in FIG. 3. As seen in FIG. 3, the load terminal of coupler 12 is shunted, providing a short circuit to ground. As discussed above, such a termination permits the largest amount of power to be reflected back towards the detector circuit is thus particularly useful where relatively weak, low amplitude transmission is contemplated. Since this arrangement does not discriminate between high and low amplitude signals, however, larger amplitude signals would also be reflected, presenting the possibility of damage to the detector circuit and other components at higher output levels.

In view of the foregoing description, it will be evident to a person skilled in the art that various modifications may be made within the scope of the invention defined in the following claims.

What is claimed:

1. A radio frequency (RF) circuit, comprising:
   an RF signal generating device for generating an RF output signal;
   a four-port RF signal coupling device, said coupling device having a first port coupled to said RF signal generation device, a second port, a third port, and a fourth port;
   a detection circuit coupled to said third port for obtaining a measurement of the amplitude of the RF output signal; and
   an impedance termination coupled to the fourth port, said impedance termination having an impedance value such that the third port receives a portion of signal energy delivered by said RF signal generating device and a portion of signal energy reflected from said fourth port;
   wherein said impedance termination has an instantaneous impedance value which varies in relation to the amplitude of the RF output signal, such that said instantaneous impedance value approximates a short circuit as said RF output signal approaches a lower amplitude threshold and approximates an open circuit as said RF output signal approaches an upper amplitude threshold.

2. The circuit of claim 1, wherein said impedance termination comprises a diode coupled to ground.

3. The circuit of claim 2, wherein said impedance termination further comprises an impedance inverter coupled to said diode, whereby said impedance termination approximates a short circuit as said RF output signal approaches a lower amplitude threshold and whereby said impedance termination approximates an open circuit as said RF output signal approaches an upper amplitude threshold so that gain is provided to signals received by said detection circuit below a first amplitude level and attenuation is provided to signals received by said detection circuit above a second amplitude level.

4. The circuit of claim 3, wherein said impedance inverter is a one-quarter wave resonator.

5. A method for maintaining the magnitude of a radio frequency (RF) signal from an RF signal amplifier at one of a plurality of levels selected by level control signals from a signal source, comprising the steps of:
   supplying the output of a third port of a four-port coupler to a detection circuit to obtain a measurement of the amplitude of the signal amplifier output, a first port of the four-port coupler being coupled to the output of the signal amplifier and the third port receiving a portion of signal energy output by the signal amplifier and a portion of signal energy reflected from an impedance termination coupled to a fourth port of the four-port coupler; and
   applying a variable control signal to the signal amplifier to adjust the output of the signal amplifier by an amount related to the magnitude of the measurement obtained during said supplying step, wherein the impedance termination is an impedance inverter in combination with a diode.

6. The method of claim 5, wherein said impedance inverter is a quarter-wave transmission line resonator.

7. The method of claim 5, wherein said impedance inverter is a short circuit electrically interconnecting the fourth port and ground.

8. A circuit for controlling the magnitude of the output power of a radio frequency (RF) signal, comprising:
   an amplifier having a variable output power for amplifying the RF signal;
   a transmitting antenna coupled to said amplifier for transmitting an amplified RF transmission signal having an amplitude;

a coupler for coupling said amplifier and said transmitting antenna, said coupler having a first terminal coupled to said amplifier, a second terminal coupled to said transmitting antenna, a third terminal, and a fourth terminal, and including a transmission line interconnecting said third and fourth terminals;

a detection circuit coupled to the third terminal of said coupler for receiving a coupled signal therefrom and for generating a first signal corresponding to the amplitude of the amplified RF transmission signal;

a transmission signal output level controller responsive to the signal output by said detection circuit for applying a variable control signal to the amplifier to adjust the output of the amplifier by an amount related to changes in the magnitude of the first signal; and a variable resistance coupled to said fourth terminal for defining a path to ground of varying resistance, said resistance varying in response to the amplitude of the RF transmission signal.

9. The circuit of claim 8, wherein said variable resistance comprises a diode.

10. The circuit of claim 9, wherein said variable resistance further comprises an impedance inverter.

11. The circuit of claim 10, wherein said impedance inverter is a quarter wave resonator.

* * * * *